United States Patent

[11] 3,611,062

[72] Inventor Arthur J. Rideout
Poughkeepsie, N.Y.
[21] Appl. No. 722,126
[22] Filed Apr. 17, 1968
[45] Patented Oct. 5, 1971
[73] Assignee International Business Machines Corporation
Armonk, N.Y.

[54] PASSIVE ELEMENTS FOR SOLID-STATE INTEGRATED CIRCUITS
6 Claims, 7 Drawing Figs.

[52] U.S. Cl. 317/234, 317/242
[51] Int. Cl. H01l 5/02
[50] Field of Search 317/234 (22), 234 (9), 235 (21), 234 (7), 234 (5), 235 (48)

[56] References Cited

UNITED STATES PATENTS

| | | | |
|---|---|---|---|
| 2,666,814 | 1/1954 | Shockley | 317/235 |
| 2,930,950 | 3/1960 | Teszner | 317/235 |
| 2,989,650 | 6/1961 | Daucette et al. | 317/234 X |
| 3,022,472 | 2/1962 | Tanenbaum et al. | 317/234 X |
| 3,025,438 | 3/1962 | Wegener | 317/235 |
| 3,171,068 | 2/1965 | Denkewalter et al. | 317/234 |
| 3,200,354 | 8/1965 | White | 317/234 X |
| 3,416,045 | 12/1968 | Zerbst et al. | 317/234 |
| 3,006,791 | 10/1961 | Webster | 317/235 X |
| 3,252,003 | 5/1966 | Schmidt | 317/235 X |
| 3,506,888 | 4/1970 | Siebertz et al. | 317/234 |

*Primary Examiner*—James D. Kallam
*Attorneys*—Hanifin and Clark and Frank C. Leach, Jr.

ABSTRACT: A capacitor is formed for a monolithic integrated circuit with an increased capacitance without a decrease in breakdown voltage by forming the junction in a plurality of curved portions rather than a straight portion. The junction may be formed by either a single or double diffusion through parallel slots in a mask to permit diffusion. It also may be formed by either a single or double diffusion through orthogonal families of parallel slots. A resistor is formed by two diffusions to form the junction rather than a single diffusion whereby the gradient of the doping profile in the depletion layer of the junction is reduced. This reduces the parasitic capacitance at the junction for a given resistance whereby the resistor may be utilized at a higher cutoff frequency to permit the resistor to be utilized in higher frequency circuits.

INVENTOR
ARTHUR J. RIDEOUT

BY Frank C. Leach Jr.

ATTORNEY

PASSIVE ELEMENTS FOR SOLID-STATE INTEGRATED CIRCUITS

Passive elements for monolithic integrated circuits include capacitors and resistors. The capacitors and resistors are normally formed in a monolithic integrated circuit by diffusing an impurity of one type into an impurity of the opposite type to form a junction between the conductivities of opposite types. For a capacitor, connections are made to the opposite sides of the junction while the resistor utilizes connections at two spaced points on the upper surface of the upper conductivity material of the junction.

In a planar capacitor for a monolithic integrated circuit, the capacitance of the capacitor is directly proportional to the area of the junction. Thus, in forming junction capacitors for monolithic integrated circuits, an increased capacitance for the junction capacitor has required an increased area of the substrate. Thus, presently available junction capacitors for monolithic integrated circuits have required the substrate area to be increased when an increase in capacitance is required.

The present invention utilizes a junction capacitor for monolithic integrated circuits in which the capacitance for a given area in a substrate is substantially increased in comparison with the capacitance of presently formed planar diffused junctions. The present invention forms the diffused junction with at least one of its width and length dimensions substantially greater than the linear distance that has previously resulted when forming a planar diffused junction. Thus, the present invention produces a substantially greater capacitance for a given area in a substrate. Accordingly, this permits either the use of a capacitor having a greater capacitance for a given area of the substrate or substantially reduces the area required for a capacitor of a given capacitance.

In forming planar diffused junctions, the capacitor has been formed by diffusing an impurity through a single large opening in a layer of a mask such as silicon dioxide, for example. For a unit length of the junction, the capacitance of a planar diffused junction is approximately equal to the product of the capacitance per unit area of the diffused junction and the width of the diffused junction.

In diffusing a junction capacitor, the diffusion thickness is $X_j$. With the width of the opening in the silicon dioxide layer being equal to $100X_j$, for example, the total width of the junction is equal to $100X_j$ plus p*i* $X_j$. The latter quantity is due to the diffusion that occurs under the layer of silicon dioxide at each end of the width of the junction due to the planar process. Since this amount of diffusion forms a quarter of a circle on each end of the straight portion of the junction with a radius of $x_j$, this results in the periphery of these two portions of the junction being the circumference of a half of a circle with a radius of $X_j$.

In the present invention, this straight portion of the junction is replaced by a plurality of semicircles with each having a radius of $X_j$. If the linear width is still assumed to be $100X_j$. then the total number of semicircles is 50 since each semicircle would have a maximum radius of $2X_j$. With each semicircle having a circumference of *pi* $X_j$ and the quarter circles still being formed on each end due to diffusion of the impurity beneath the silicon dioxide layer, the diffused junction has a total width of 51 *pi* $X_j$ (50 *pi* $X_j$ +*pi* $X_j$).

Accordingly, when using the method of the present invention, the width of the diffused junction forming the capacitor is approximately $160X_j$ whereas the diffused junction with a linear width has a width of approximately $103X_j$. Thus, the present invention provides an increase of substantially 60 percent in the capacitance of a junction for a given surface area since the capacitance is directly proportional to the width distance.

The capacitance of the diffused junction per unit width is equal to the product of the capacitance per unit area times the length of the diffused junction. In the same manner as described for the width, the capacitance along the length of the diffused junction per unit width also could be increased approximately 60 percent. Accordingly, if the diffused junction capacitor is formed in both its width and length directions by the method of the present invention, the capacitance becomes approximately 2.5 times the capacitance of a typical diffused junction in which its length and width are linear.

Additionally, the capacitor, which is formed by the method of the present invention, has the same breakdown voltage as a planar diffused junction. This is because the impurity profile is the same whereby the depletion layer is the same. Accordingly, the use of the increased area at the junction does not cause any reduction in the breakdown voltage.

In forming a diffused resistor for use in a monolithic integrated circuit, an impurity of one conductivity is diffused into an area of the other conductivity type to form a junction. This resistor has previously been formed by a single diffusion.

The junction, which is formed by the diffusion, has a parasitic capacitance, which is directly proportional to the one-third power of the gradient of the impurity distribution in the depletion layer of the junction. Thus, a decline in the gradient results in a decrease in the parasitic capacitance.

Since the cutoff frequency is inversely proportional to the parasitic capacitance of the junction of the diffused resistor and to the resistance, the parasitic capacitance limits the frequency at which the resistor may be employed without losing its desired impedance. When the cutoff frequency is reached, the resistor ceases to provide the desired impedance in the monolithic integrated circuit. Accordingly, if the parasitic capacitance can be reduced for a given resistance without affecting the resistance of the resistor, the cutoff frequency of the resistor can be increased.

While the gradient of the impurity concentration in the depletion layer could be changed by reducing the bulk concentration of the impurity of the area into which the impurity of the other type is diffused, the bulk concentration is limited because design considerations for the transistor structure normally have precedence over design considerations of a resistor. Accordingly, the bulk concentration cannot normally be varied to reduce the parasitic capacitance of a diffused resistor.

The present invention satisfactorily solves the foregoing problem without requiring any variation in the bulk concentration whereby the design consideration of the transistor structure may govern and without affecting the resistance of the resistor. Thus, for a diffused resistor having a given resistance, the present invention permits the resistor to have a higher cutoff frequency whereby the resistor may be utilized in circuits operating at higher frequencies than have previously been available.

The present invention satisfactorily solves the foregoing problem by using a double diffusion to form the resistor. In this double diffusion, the concentration of the impurity in one of the diffusions is substantially greater than the impurity concentration in the other diffusion. As a result, the same resistance is obtained for a given diffusion depth with a smaller impurity concentration gradient in the depletion layer than would be obtained by using a single diffusion having substantially the same average concentration as the average concentration of the two diffusions.

Of course, when comparing the resistor produced by the method of the present invention with a resistor formed by a single diffusion having substantially the same average impurity concentration, it should be understood that the single diffusion would be without a change in temperature. It is known that a single diffusion in which the temperature is changed during the diffusion cycle could reduce the parasitic capacitance by changing the gradient of the impurity distribution in the depletion layer of the junction. However, this single diffusion process in which the temperature is changed is substantially complicated and relatively expensive in comparison with the method of the present invention.

While the gradient of the impurity distribution in the depletion layer of the junction could be decreased by reducing the doping concentration to lower the parasitic capacitance, it would be necessary to increase the diffusion thickness to produce the same resistance. This is because the increase in the diffusion thickness would compensate for the decrease in the doping. However, this single type of diffusion would have two disadvantages in that the increase in the thickness of the diffusion layer would produce a slower transistor and the reduction in the doping profile could only be accomplished by a lower surface concentration. The lower surface concentration causes a poorer temperature coefficient of resistance to decrease the temperature range of the resistor whereby the resistance falls when the resistor is operated outside the temperature range.

A diffused resistor formed by the method of the present invention satisfactorily eliminates the foregoing problems since it results in a relatively high surface concentration to produce a good temperature coefficient of resistance. Likewise, by using a double diffusion, the thickness of the diffused layer is relatively shallow. As a result, these two parameters of the resistor, formed by the method of the present invention, produce not only a good resistor but also a good transistor. This is because the transistor, which usually has its base formed at the same time as the resistor is forming a monolithic integrated circuit, requires a shallow diffused layer. It also requires a high surface concentration.

An object of this invention is to provide methods for forming passive elements for monolithic integrated circuits by two diffusions of an impurity of the same conductivity type.

Another object of this invention is to provide passive elements for monolithic integrated circuits having improved characteristics.

A further object of this invention is to provide a diffused junction capacitor having a relative high capacitance for a given surface area of the junction.

Still another object of this invention is to provide a diffused resistor for monolithic integrated circuits having a relatively high cutoff frequency in comparison to presently available diffused resistors.

The foregoing and other objects, features, and advantages of the invention will be more apparent from the following more particular description of the preferred embodiments of the invention as illustrated in the accompanying drawing.

Figure 1:
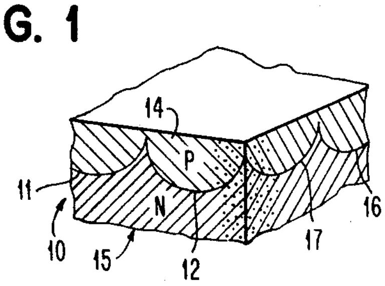
FIG. 1 is a perspective view of a portion of a junction capacitor formed in accordance with a method of the present invention.

Referring to the drawings and particularly FIG. 1, there is shown a junction capacitor 10 that is formed in accordance with the method of the present invention. As shown in FIG. 1, the capacitor 10 has its width 11 formed by a plurality of substantially semicircular radial arcs 12. That is, each of the arcs 12 has a very slight straight portion that is equal to the width of the opening in the oxide through which the impurity is diffused to form the arc. Each of the semicircular arcs 12 has a radius no greater than the thickness, $X_j$, of a diffused layer 14. The diffused layer 14 is of one conductivity such as P-type, for example, while the area into which the P-type impurity is diffused such as substrate 15 is of the other conductivity type. Thus, in this situation, the substrate 15 would be of N-type conductivity.

The capacitor 10 has its length 16 formed by a plurality of substantially semicircular radial arcs 17. In the same manner as described for the arcs 12, the arcs 17 will have a slight straight portion. Each of the semicircular arcs 17 is of a radius substantially equal to the radius of each of the semicircular arcs 12. Thus, the radius of each of the semicircular arcs 17 can be no greater than the thickness, $X_j$, of the diffused layer 14.

With the junction capacitor 10 formed as shown in FIG. 1, the width 11 of the junction capacitor 10 is substantially greater than the linear distance of the width of the junction capacitor 10. Similarly, the length 16 of the junction capacitor 10 is substantially greater than the linear distance of the length of the junction capacitor 10. Thus, the junction capacitor 10 has a substantially increased area without any increase in the surface area whereby a substantially greater capacitance for a given surface area of the junction capacitor 10 is obtained.

In forming the junction capacitor 10, the first step is to form a layer 10 of an oxide such as silicon dioxide, for example, across the entire surface of the substrate 15 by thermally oxidizing the surface of the substrate 15. The substrate 15 may be formed with an epitaxial layer thereon. The bulk of the substrate could have a thickness of about 8 mils with an N-type resistivity of 0.02 ohm-cm. with the epitaxial layer having a thickness of 6 to 8 microns with an N-type resistivity of 0.2 ohm-cm.

Figure 2:
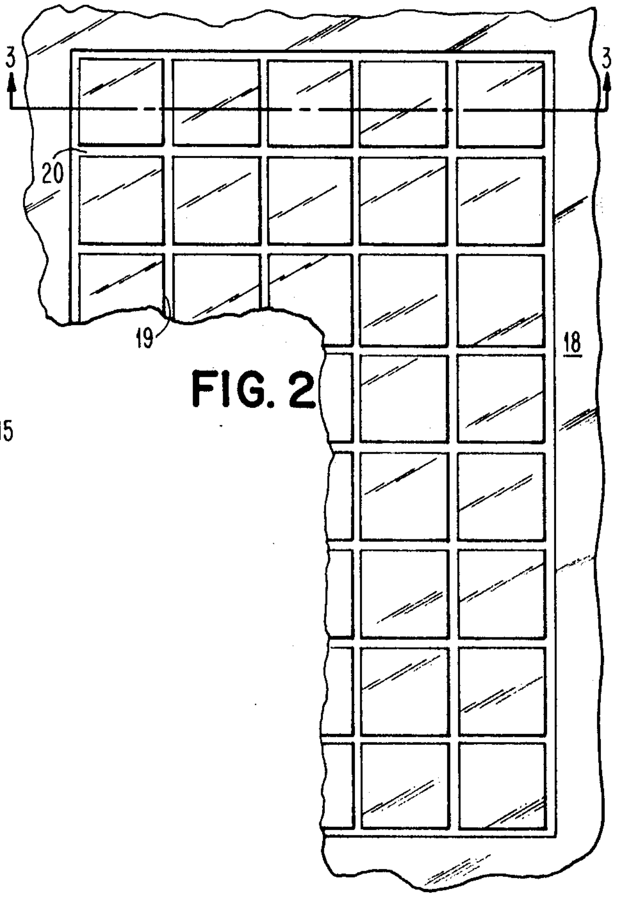
FIG. 2 is a top plan view of a portion of a substrate in which the capacitor of the present invention is to be formed and showing the diffusion pattern formed in the layer of silicon dioxide on top of the substrate.

After the oxide layer 18 has been formed on the surface of the substrate 15, a first set of a plurality of parallel slots 19 is formed in the longitudinal direction while a second set of a plurality of parallel slots 20 is formed in the width direction. The slots 19 are substantially perpendicular to the slots 20. As shown in FIG. 2, the portion of the layer 18, which remains in the area in which the slots 19 and 20 are formed, comprises only a plurality of separate islands.

The slots 19 and 20 may be formed in the layer 18 of silicon dioxide by any suitable etching means. For example, the photoresist technique could be employed. In the photoresist technique, the photoresist would be deposited on the layer 18 of silicon dioxide and exposed. The etching out of the exposed oxide areas would produce the slots 19 and 20.

A suitable P-type conductivity impurity such as boron is then diffused through the slots 19 and 20. The diffusion is preferably by the drive-in technique in which a two step procedure is employed.

Thus, in the first or predeposition step, the baron is deposited on the substrate 15 at a temperature of 1200° C. for 85 minutes. It should be understood that the first 10 minutes of the 85 minutes is for warm-up to reach the temperature of 1200° C. The concentration of the boron would preferably be $1.8\times10^{18}$ atoms/cm.$^3$. The resulting sheet resistance is 460 ohms/square and the junction depth in a 1 ohm-cm. N-type test wafer is 0.1015 mil.

Then, during the drive-in step, the boron, which is in the substrate 15 from the diffusion during the predeposition step, is redistributed by the high temperature of the drive-in. During the drive-in step, oxygen is directed over the substrate for 5 minutes, then steam for 40 minutes, and then oxygen for 5 minutes with the substrate 15 at a temperature of 970° C. The steam causes an oxide layer to be grown on the surface of the substrate 15 into which the boron has been diffused. The first 5 minutes, when oxygen is initially used, is for warm-up.

This produces a sheet resistance of 517 ohms/square. This creates a junction depth of 0.116 mil in a 1 ohm-cm. N-type test wafer and a junction depth, $X_j$, of 0.0865 mils in the substrate 15.

The diffusion coefficient during the predeposition step is $1.05\times10^{112}$ cm.$^2$/sec. During the drive-in step, the diffusion coefficient is $3\times10^{114}$ cm.$^2$/sec.

Figure 3:
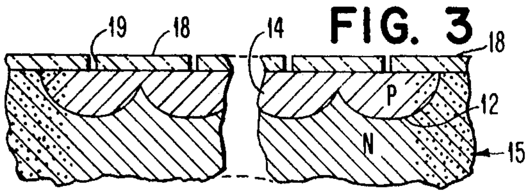
FIG. 3 is a sectional view taken along line 3—3 of FIG. 2 and showing the resultant diffusion through the silicon dioxide layer of FIG. 2.

As shown in FIG. 3 for the width 11 of the junction capacitor 10, the diffusion of the P-type conductivity through the slots 19 results in a plurality of the semicircular arcs 12 being formed to comprise the width of the junction capacitor 10. In order that the semicircular arcs 12 of the junction capacitor 10 will form a continuous connection, it is necessary that the distance between the longitudinal axes of adjacent of the slots 19 be less than twice the radius of the semicircular arcs 12. Accordingly, the diffusion of the P-type conductivity into the substrate 15 must be controlled so as to be greater than half the distance between the longitudinal axes of the adjacent slots 19. Of course, the slots 19 must have sufficient size to permit diffusion therethrough to produce this desired relation.

By using an electron beam with the photoresist technique for exposing the photoresist, each of the slots 19 could have a width of 1 micron with the longitudinal axes of the adjacent slots 19 being spaced 2 microns apart whereby each of the islands of the layer 18 of silicon dioxide would also have a width of 1 micron. If conventional exposure of the photoresist by light were employed rather than the electron beam exposure of the photoresist, then the longitudinal axes of the adjacent slots 19 would be 2.5 microns apart whereby the islands of the layer 18 of silicon dioxide would have a width of 1.5 microns. However, with each of the slots 19 having a width of 1 micron, the longitudinal axes of the adjacent slots 19 probably would be about 10 microns apart.

The semicircular arcs 17 for the length 16 of the junction capacitor 10 are formed at the same time as the semicircular arcs 12 through a single diffusion. That is, the P-type conductivity also is diffused through the slots 20 at the same time it is diffused through the slots 19. Accordingly, the same technique would be employed as described in forming the width 11 of the junction capacitor 10 to form the length 16 of the junction capacitor 10.

After the P layer 14 is diffused through the slots 19 and 20 into the substrate 15, an N+ area is diffused into the substrate 15 to form a second contact area for the junction capacitor 10. That is, the upper surface of the diffused layer 14 forms one contact area for the junction capacitor 10 while the other contact area must come from the substrate 15 since it forms the other side of the junction capacitor 10.

While this N+ contact area is not shown, it should be understood that it would be outside of the area having the slots 19 and 20. However, it would be necessary to form an opening in the layer 18 of silicon dioxide to permit this diffusion to occur.

The N+ contact area also will be formed by drive-in diffusion. The impurity could be any suitable N-type impurity such as phosporous having a concentration of $2\times10^{21}$ atoms/cm.$^3$, for example. In the predeposition step, the impurity would be applied for 40 minutes at a temperature of 970° C. It should be understood that the first 5 minutes are warm-up time. During the drive-in step, first oxygen and then steam would be supplied for 10 and 5 minutes, respectively, at 970° 970° C. with the first 5 minutes being for warm-up. The concentration of the impurity would be $1.3\times10^{21}$ atoms/cm.$^3$. The sheet resistance is 6.13 ohms/square, and the junction depth in a P-type 1 ohm-cm. test wafer is 0.0460 mil.

During the predeposition step, the diffusion coefficient would be $8\times10^{114}$ cm.$^2$/sec.

Figure 4:
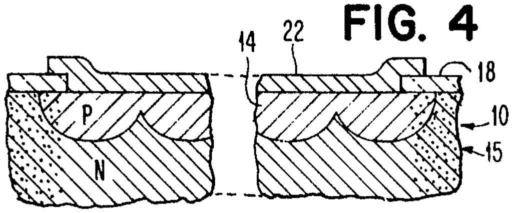
FIG. 4 is a sectional view, similar to FIG. 3, but showing the capacitor completed and metallized for connection to a contact of a monolithic integrated circuit in which it is to be disposed.

After the junction capacitor 10 has been formed, the upper surface of the diffused layer 14 and the substrate 15 has a portion of the layer 18 of silicon dioxide removed therefrom along with the layers of silicon dioxide grown during the diffusions of the P layer 15 and N+ contact area. Thereafter, a film 22 of metal such as aluminum, for example, is deposited on the upper surface of the diffused layer 14 (see FIG. 4). Thus, metallic contact is made with the diffused layer 14 of P-type conductivity of the junction capacitor 10.

It should be understood that a second opening is formed in the layer 18 (not shown) of the silicon dioxide to permit another film of metal such as aluminum, for example, to be deposited on the upper surface of the N+ contact area. This provides the second metallic contact for the junction capacitor 10.

Instead of using a drive-in diffusion in which a two step procedure is employed to form the diffused layer 14 in the substrate 15, the diffusion could be a single step utilizing complementary error function distribution. The P-type material, which could be boron, would have a concentration of $2\times10^{19}$ atoms/cm.$^3$. The diffusion would occur for 80 minutes at a temperature of 1100° C. with the first 10 minutes for warm-up. The resulting average sheet resistance would be 196 ohms/square, and the junction depth in a 1 ohm-cm. N-type test wafer would be 0.0398 mil.

The N+ contact area also could be formed be a single diffusion step utilizing complementary error function distribution. The impurity could be any suitable N-type impurity such as phosphorous having a concentration of $1.3\times10^{21}$ atoms/cm.$^3$, for example. The impurity would be applied for approximately 26.2 minutes at a temperature of 970° C. The diffusion coefficient would be $7\times10^{114}$ cm.$^2$/sec.

In a 1 ohm-cm. P-type test wafer, the junction depth would be 0.0248 mil. The average sheet resistance would be about 6 ohms/square.

If the distance between the longitudinal axes of the adjacent slots 19 and/or the adjacent slots 20 should be greater than twice the diffusion thickness, $X_j$, then a single diffusion would not produce the connected semicircular arcs 12 and the connected semicircular arcs 17 but they would be spaced from each other. When this occurs, it would be necessary to utilize two diffusions of the P-type impurity to produce the connected semicircular arcs. It should be understood that present photoresist techniques do not permit the size of the slots 19 and 20 to be smaller than 1 micron. This can result in the diffusion depth being limited so that the semicircular arcs will not be connected.

Figure 5:
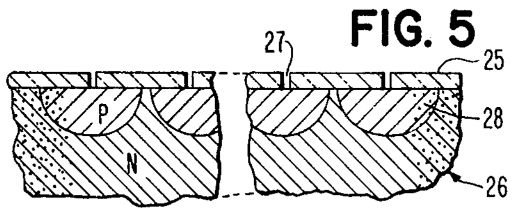
FIG. 5 is a sectional view, similar to FIG. 3, but showing the results of a first diffusion of a different method for forming the junction capacitor.

As shown in FIG. 5, a layer 25 of an oxide such as silicon dioxide, for example, is formed on top of a substrate 26 having a conductivity such as N-type, for example. The layer 25 may be thermally oxidized on the surface of the substrate 26, which may be formed with an epitaxial layer in the same manner as the substrate 15.

Then, in the same manner as previously described for a single diffusion in forming the slots 19 in the layer 18 of silicon dioxide, parallel slots 27 are formed along the length of the layer 25 if silicon dioxide. It should be understood that a similar set of parallel slots, which would be disposed substantially perpendicular to the slots 27, would be formed along the width of the layer 25 of the silicon dioxide in the same manner as the slots 20 are formed. However, the description of the double diffusion method will be limited to the formation of the width of the junction capacitor.

After the slots 27 are formed in the layer 25 of the silicon dioxide, a P-type impurity such as a high concentration of boron, for example, is diffused through the slots 27 to form P-type conductivity areas 28 in the substrate 26. The areas 28 are isolated from each other by portions of the N-type substrate 26 as shown in FIG. 5. The boron is preferably diffused in the same manner but for a shorter time and has the same surface concentration as described for the single diffusion in forming the junction capacitor 10.

Figure 6:
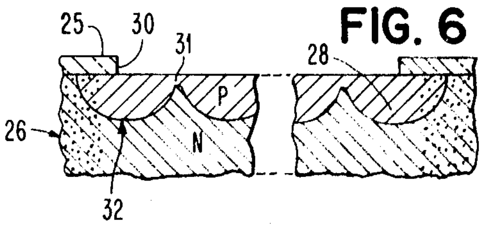
FIG. 6 is a sectional view of the structure of FIG. 5 after a second diffusion has been completed.

The layer 25 of the silicon dioxide then has a large opening 30 formed therein by suitable etching means such as the photoresist technique, for example (See FIG. 6). The opening 30 is preferably the same width as the distance between the outer edges of the outer slots 27. A similar arrangement would exist for the longitudinal distance of the opening 30.

A second diffusion of a P-type conductivity material, which can have a concentration the same as, larger than, or smaller than, the first diffusion, is then diffused through the opening 30 in the layer 25 of the silicon dioxide. This results in a diffused layer 31 of P-type conductivity being formed to connect the P-type areas 28 to each other as shown in FIG. 6.

It should be understood that the second diffusion of the P-type impurity could be only through slots formed in the layer 25 with the slots exposing the areas of the substrate 26 not having the P-type areas 28. It also should be understood that the second diffusion of the P-type conductivity impurity would be carried out in the same manner as described for the first diffusion. Furthermore, diffusion of the N+ contact area would be carried out after the second P-type diffusion occurs rather than after the first P-type diffusion.

As a result, a junction capacitor 32 is formed that has a width substantially greater than its linear width. Likewise, the length of the junction capacitor is similarly formed to have its length substantially greater than its linear distance. This double diffusion does not produce quite the same amount of increased capacitance in the junction capacitor 32 for a given surface area as does the single diffusion method employed to form the junction capacitor 10. However, the increase in capacitance of the junction capacitor 32 is almost equal to the increase in the junction capacitor 10.

The distance between each of the areas 28, which form substantially semicircular arcs, determines the amount of reduction of the capacitance for the junction capacitor 32 in comparison with the junction capacitor 10. That is, the closer that the areas 28 are to each other, the closer the capacitance of the junction capacitor 32 is in comparison with the capacitance of the junction capacitor 10.

It should be understood that metallization of the upper surface of the P-type areas 28 and the layer 31 of P-type material would be made by having a film of metal deposited thereon in the same manner as described for the junction capacitor 10. This is necessary to form one of the contacts for the junction capacitor 32. While the other contact for the capacitor 10 and the capacitor 32 has been described as an N+ area formed in the upper surface of he substrate 15 or 26, it should be understood that the other contact could be the N-type substrate 15 and 26, respectively. In either arrangement, a film of metal is deposited to form the contact with the appropriate contact area.

While each of the junction capacitors 10 and 32 has been described as having the area of the capacitor increased in both its longitudinal and width directions, it should be understood that the increased area could be formed along only the width or length of the junction capacitor. For example, only the width of the junction capacitor 32 might be formed greater than its linear distance in the manner shown and described in FIGS. 5 and 6 while the length of the capacitor 32 would be formed along its linear distance. This would still produce a substantial increase of approximately 60 percent in the capacitance of the capacitor 32 in comparison with the capacitance of a capacitor having both its length and width formed substantially linear. The only difference in the method of forming either the junction capacitor 10 or 32 would be to utilize only one of the sets of slots rather than two sets of substantially perpendicular slots.

A diffused resistor for a monolithic integrated circuit has its resistance determined by the product of the average sheet resistance of the diffused resistor and the ratio of the length to the width of the diffused resistor. The average sheet resistance is approximately inversely proportional to the average concentration of the impurity between the junction and the surface of the resistor and the thickness of the diffusion layer or the distance of the junction from its upper surface, $X_j$.

Thus, it would seem that to obtain an increase in the total resistance of a diffused resistor for a given ratio of the length of the resistor to its width, it would only be necessary to either decrease the average impurity concentration or decrease the thickness of the diffusion layer. Either of these would result in an increase in the sheet resistance.

However, the average impurity concentration is related to the surface concentration. In order to have a low temperature coefficient of resistance so that the temperature range of the circuit can be made sufficiently broad to operate is desired environments, it is necessary to have a high surface concentration. Thus, the reduction of the average impurity concentration is limited because of the required surface concentration.

Furthermore, the parasitic capacitance of the junction is directly proportional to the one-third power of the impurity gradient in the depletion layer of the junction. Thus, with the surface concentration being required to be relatively high to obtain the lower temperature coefficient of resistance, an effort to have a lower average concentration of impurity will result in the gradient of the concentration of the impurity in the depletion layer being greater whereby the parasitic capacitance increases.

Accordingly, the sheet resistance of a diffused resistor cannot reply upon a decrease in the average impurity concentration to increase the sheet resistance. Thus, the value of the sheet resistance cannot be increased by merely decreasing the average impurity concentration because of the undesirable increase in parasitic capacitance resulting therefrom.

Therefore, while a higher resistance would be obtained if the average impurity concentration were decreased, the parasitic capacitance would be increased to reduce the cutoff frequency of the resistor so as to limit its utilization. Thus, the average concentration of the impurity may not be satisfactorily utilized to produce an increased resistance for a given area of the diffused resistor.

Likewise, if it were attempted to reduce the thickness of the diffusion layer, this also would result in the gradient of the impurity concentration in the depletion layer being greater to cause an increase in parasitic capacitance. This is due to the required high surface concentration and the smaller depth from the surface at which the junction is located. Therefore, while a decrease in the diffusion layer thickness would produce an increase in the sheet resistance, it also results in an increase in the parasitic capacitance.

Accordingly, when forming a diffused resistor with a single diffusion at a given temperature, the average sheet resistance is limited within predetermined ranges. These are determined by the parasitic capacitance that it is permissible for the specific resistor to have. This must be reconciled with the amount of substrate area that is available for the diffused resistor in the monolithic integrated circuit.

Since it is desired for the diffused resistor to have as high sheet resistance as possible in order to reduce the area required for the diffused resistor, it is desirable to be able to produce a low average concentration by using a shallow diffusion with a high surface concentration of the impurity without an increase in the parasitic capacitance. Thus, if the parasitic capacitance for a given resistance of a diffused resistor could be reduced, this would permit the diffused resistor to be capable of operating at higher frequency. Therefore, the monolithic integrated circuit would not be as limited in its frequency range.

Figure 7:
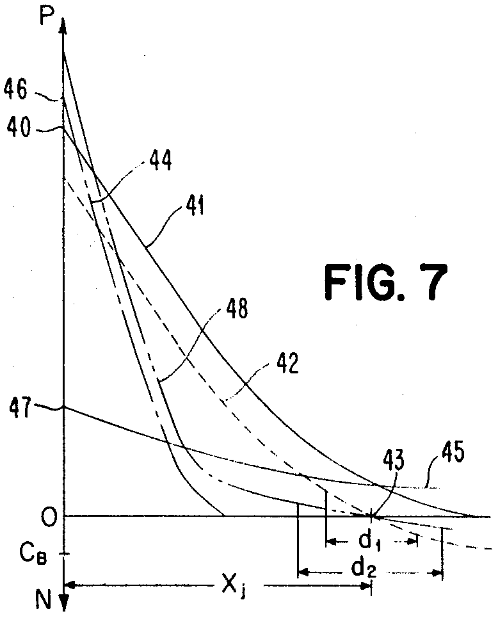
FIG. 7 is a diagram showing the impurity distribution in forming a diffused resistor in accordance with a double diffusion method of the present invention in comparison with the impurity distribution of a presently available single diffusion method.

Referring to FIG. 7, there is shown a diagram illustrating the doping profiles or impurity distributions for a diffused resistor. The distribution of the impurity is linearly presented in this diagram.

The concentration of P-type impurity is indicated in an upward vertical direction from 0 while the concentration of N-type impurity is indicated in a downward vertical direction from 0. The distance from the upper surface of the diffused resistor is indicated in a horizontal direction to the right.

If the bulk concentration, $C_B$, of the substrate is of an N-type, then the diffused impurity would be a P-type. With a bulk concentration, $C_B$, and a junction depth of $X_j$ as indicated in FIG. 7, a single diffusion having a surface concentration as indicated at 40 will produce an impurity distribution curve 41 of the P-type impurity through the substrate. The difference between the curve 41 of the P-type impurity concentration and the bulk concentration, which is the same throughout the substrate in which the diffused resistor is formed, will produce an impurity concentration curve 42 through the substrate.

As shown in FIG. 7, the curve 42 intersects the 0 concentration line at 43, which is the junction location from the upper surface of the substrate. The gradient of the curve 42 in the depletion layer $d_l$ determines the parasitic capacitance of he diffused resistor.

In the method of the present invention for forming a diffused resistor, two diffusions are employed to form the diffused resistor with the concentration of one of the diffusions being substantially greater than the concentration of the other diffusion. As shown in FIG. 7, the diffusion of an impurity of a substantially high concentration is indicated by an impurity concentration curve 44 while the diffusion distribution of an impurity of a lower concentration is indicated by curve 45.

It should be observed that the curve 44 essentially terminates before the depletion layer $d_2$. This is necessary in order that there will not be a highly doped region adjacent the junction whereby the depletion layer would be narrowed. If the depletion layer should be narrowed, this also would result in an increased parasitic capacitance because the capacitance is inversely proportional to the thickness of the depletion layer.

The surface concentration of the diffusion of higher concentration (curve 44) being at point 46, which is grater than the surface concentration at 40 for the single diffusion. Thus, the surface concentration produced by the impurity of high concentration results in a lower temperature coefficient of resistance than is produced by the single diffusion.

The surface concentration of the diffusion of lower concentration (curve 45) is at point 47, which is much smaller than either point 40 or 46. When the surface concentration 47 of the diffusion of lower concentration is added to the surface concentration at point 46, this total is even greater whereby the temperature coefficient of resistance is even lower.

The doping profile for the two diffusions of substantially different concentrations less the bulk concentration, $C_B$, is indicated by curve 48. The curve 48 passes through the point 43, which indicates the junction location, and the depletion layer $d_2$ with a much smaller gradient then the curve 42. It should be understood that the curve 48 produces the depletion layer $d_2$, which is wider for a given applied reverse bias voltage than the depletion layer $d_1$.

Thus, the parasitic capacitance of the diffused resistor, which is formed by the doping profiles of the curves 44 and 45, is substantially smaller than the parasitic capacitance of a diffused resistor formed by a single diffusion at a single temperature. As a result, the diffused resistor of the present invention may be operated at higher frequencies before the cutoff frequency is reached in comparison with a single diffused resistor, which has the same average sheet resistance, the same junction depth, and the same depletion layer. Furthermore, the diffused resistor, which is formed by the method of the present invention, may be operated in environments with wider temperature ranges than a resistor formed by a single diffusion due to the lower temperature coefficient of resistance resulting from the higher surface concentration.

As an example of forming the double diffused resistor, a layer of oxide such as silicon dioxide, for example, could be formed across the entire surface of the substrate in which the diffused resistor is to be formed by thermally oxidizing the surface of the substrate. The substrate could have the same properties as the substrates 15 and 26.

After the oxide layer has been formed on the surface of the substrate, an opening would be formed in the substrate with the desired ratio of length to width to produce the desired resistance of the diffused resistor in accordance with its sheet resistance. The photoresist technique could be employed to form the opening in the silicon dioxide.

A suitable P-type conductivity impurity such as boron is then diffused through the slot by drive-in diffusion. The boron could have a concentration of $1.8\times10^{18}$ atoms/cm.$^3$.

In the predeposition step, the boron would be diffused for 85 minutes at a temperature of 1200° C. The first 10 minutes are warm-up time.

Then, the drive-in step would occur with the substrate at a temperature of 970° C. The boron, which is in the substrate from the diffusion during the predeposition step, is redistributed by the high temperature of the drive-in. During the drive-in step, oxygen is directed over the substrate of the first 5 minutes, then steam for 40 minutes, and then oxygen for 5 minutes. The steam causes an oxide layer to be grown on the surface of the substrate into which the boron has been diffused.

The diffusion coefficient for the predeposition step is $1.05\times10^{112}$ cm.$^2$/sec. For the drive-in step, the diffusion coefficient is $3\times10^{114}$cm.$^2$/sec.

The average sheet resistance produced by this diffusion is 517 ohms/square with a junction depth, $X_j$, of 0.0865 mil. During further processing, the junction depth increases to 0.0918 mil without any change in average sheet resistance. The depth of the junction, $X_j$, is 0.116 mil in a 1 ohm-cm. N-type test wafer and the surface concentration is $1.8\times10^{18}$ atoms/cm.$^3$.

It should be understood that the second diffusion normally will occur at the time the second diffusions are being utilized in other portions of the substrate to form the monolithic integrated circuit. Therefore, it is necessary to again form the desired opening in a new layer of silicon dioxide in the same manner as described for forming the junction capacitor 32.

In the second diffusion, the boron has a concentration of $1.6\times10^{20}$ atoms/cm.$^3$ when it is disposed on the surface of the diffused layer during the predeposition step. The temperature is raised to 1000° C., and the total time is 65 minutes with 10 minutes being required for warm-up.

During the drive-in step, the concentration of the boron is reduced to $2.1\times10^{19}$ atoms/cm.$^3$. Steam is used for the drive-in and is maintained for 15 minutes at 1100° C. with 5 minutes for warm-up. This produces a sheet resistance of about 140.4 ohms/square and a junction depth of 0.0469 mil in a 1 ohm-cm. N-type test wafer.

The diffusion coefficient during the predeposition step is $2.8\times10^{113}$ cm.$^2$ /sec. During the drive-in step, the diffusion coefficient is $1.4\times10^{113}$ cm.$^2$/sec. This second diffusion produces a combined diffused layer having a depth of 0.0918 mils. The average sheet resistance in the substrate is about 110 ohms/square.

After the two diffusions have been complete, a film of metal would be added to the surface of the diffused resistor to form the contacts thereto. These would be provided through the silicon dioxide layer, which has been formed during the drive-in step of the second diffusion, by etching holes in the layer to contact the surface of the diffused resistor at two spaced points. As an alternative, the contacts could be formed by using a single hole and then removing most of the metallic etching.

Instead of utilizing a drive-in diffusion in which a two step procedure is employed, each of the two diffusions for forming the double diffused resistor could be a single step utilizing complementary error function distribution. Thus, a suitable P-type conductivity impurity such as boron could be diffused through a slot, which is formed in a layer of oxide over the entire surface of the substrate as previously mentioned when describing the formation of the double diffused resistor by drive-in diffusion. The boron could have a concentration of $1\times10^{18}$ atoms/cm.$^3$ with the substrate having a bulk concentration, $C_B$, of $3\times10^{16}$ atoms/cm.$^3$. In the first and deep diffusion, the boron would be diffused for approximately 147 minutes including a warm-up time of 10 minutes at a temperature of 1200° C. The diffusion coefficient is $1.05\times10^{112}$ cm.$^2$/sec.

The average sheet resistance produced by this diffusion is 507 ohms/square. The depth of the junction, $X_j$, is 0.116 mil in a one ohm-cm. N-type test wafer, and the surface concentration is $1.8\times10^{18}$ atoms/cm.$^3$.

In the second and shallow diffusion, the boron has a concentration of $2\times10^{19}$ atoms/sec. The temperature is maintained at 1100° C. and the total time is 80 minutes with 10 minutes for warm-up.

The diffusion coefficient is $1.05\times10^{113}$ cm.$^2$/sec. This second diffusion produces an average sheet resistance of 196 ohms/square and a junction depth of 0.0398 mil in a 1 ohm/cm. N-type test wafer. The average sheet resistance in the substrate with the two diffusions is 145 ohms/square.

While the diffused resistor has been described as being formed by diffusing a P-type impurity into an N-type bulk concentration, it should be understood that the diffused resistor could be formed by diffusing an N-type impurity into a P-type bulk concentration.

In diffusing the two different concentrations of the same type of impurity into the bulk concentration of the substrate, it is preferable that the lower concentration (indicated by the curve 45) be diffused first and previously described. However, this is not a requisite for a satisfactory diffused resistor.

An advantage of this invention is that it provides a diffused junction capacitor having an increased capacitance without an increase in substrate area being required. Another advantage of this invention is that it permits a diffused resistor to be employed at higher frequencies by reducing the parasitic capacitance at the junction formed by the diffused resistor. A further advantage of this invention is that it permits a diffused resistor to be operated in relatively higher temperature environments without an increase in the parasitic capacitance at the junction formed by the diffused resistor.

While the invention has been particularly shown and described with reference to preferred embodiments thereof, it will be understood by those skilled in the art that the foregoing and other changes in form and details may be made therein without departing from the spirit and scope of the invention.

What is claimed is

1. A passive semiconductor device comprising:

a body of crystalline semiconductor material having respective regions of opposite conductivity-type exclusively forming opposite side areas of said body, each region including projecting formations within said body, said formations having curving surface shapes and interfitting with each other, said regions forming a continuous PN junction along the meeting surface therebetween, including the surface between said interfitting formations, and said PN junction having substantially greater area than the projected area thereof on a surface in a plane normal to the direction in which said formations project, and said PN junction being uninterrupted within the area defined by the edge thereof.

2. The device according to claim 1 in which said junction has its width dimension formed by a first plurality of connected and continuous substantially semicircular arcs and its length dimension formed by a second plurality of connected and continuous substantially semicircular arcs.

3. The device according to claim 2 in which: said arcs of said first plurality of connected substantially semicircular arcs are of equal radii and have the centers of adjacent arcs spaced a distance less than twice the radius of each of the arcs;

and said arcs of said second plurality of connected substantially semicircular arcs are of equal radii and have the centers of adjacent arcs of the second plurality spaced a distance less than the radius of each of the arcs of the second plurality.

4. The device according to claim 3 in which said junction has separate metallic connections to the conductivities on opposite sides thereof to from electrical connections on opposite sides of said junction so that a capacitor is formed.

5. The device according to claim 1 in which said junction has separate metallic connections to the conductivities on opposite sides thereof to form electrical connections on opposite sides of said junction so that a capacitor is formed.

6. The device according to claim 1 in which said junction has an effective surface area, at least twice as great as the projected area of said junction.